(12) United States Patent
Perreaut

(10) Patent No.: US 12,537,326 B2
(45) Date of Patent: Jan. 27, 2026

(54) CONNECTION DEVICE FOR AN ELECTRICAL COMPONENT

(71) Applicant: PLASTIC OMNIUM ADVANCED INNOVATION AND RESEARCH, Brussels (BE)

(72) Inventor: Xavier Perreaut, Brussels (BE)

(73) Assignee: PLASTIC OMNIUM ADVANCED INNOVATION AND RESEARCH, Brussels (BE)

( * ) Notice: Subject to any disclaimer, the term of this patent is extended or adjusted under 35 U.S.C. 154(b) by 0 days.

(21) Appl. No.: 18/837,248

(22) PCT Filed: Mar. 24, 2023

(86) PCT No.: PCT/EP2023/057608
§ 371 (c)(1),
(2) Date: Feb. 24, 2025

(87) PCT Pub. No.: WO2023/180517
PCT Pub. Date: Sep. 28, 2023

(65) Prior Publication Data
US 2025/0183573 A1 Jun. 5, 2025

(30) Foreign Application Priority Data
Mar. 25, 2022 (LU) .................................... 501724

(51) Int. Cl.
*H01R 13/05* (2006.01)
*H01R 43/16* (2006.01)
*H01R 105/00* (2006.01)

(52) U.S. Cl.
CPC ............. *H01R 13/05* (2013.01); *H01R 43/16* (2013.01); *H01R 2105/00* (2013.01); *H01R 2201/26* (2013.01)

(58) Field of Classification Search
CPC .... H01R 13/05; H01R 43/16; H01R 2105/00; H01R 2201/66
(Continued)

(56) References Cited

U.S. PATENT DOCUMENTS 3,900,769 A * 8/1975 Russo, Jr. ............ H05K 5/0039
361/740
5,761,046 A * 6/1998 Hein .................... H05K 5/0043
361/728

(Continued)

FOREIGN PATENT DOCUMENTS

CN 103477511 A 12/2013
EP 3487006 A1 * 5/2019 ............. H01H 71/08
(Continued)

OTHER PUBLICATIONS

International Search Report issued Jun. 16, 2023, PCT/EP2023/057608 filed on Mar. 24, 2023, 2 pages.
(Continued)

*Primary Examiner* — Peter G Leigh
(74) *Attorney, Agent, or Firm* — Oblon, McClelland, Maier & Neustadt, L.L.P.

(57) ABSTRACT

The invention relates to a connection device (2) for an electrical component, which device comprises: —a housing (6), —an electrical component (4) accommodated in the housing (6), —at least one electrical pin (12) comprising a portion (14) connected to the electrical component (4) and a free portion (16), and —a connection interface (10) attached to the housing (6), the connection interface (10) comprising at least one opening (22) for enabling the free portion (16) of the at least one electrical pin (12) to pass therethrough and the free portion (16) of the at least one electrical pin (12) to be locked in place in the at least one opening (22), one end of the free portion (16) of the at least one electrical pin (12) extending at a predetermined distance from the at least one
(Continued)

opening (22). The at least one electrical pin (12) further comprises a deformable portion (18) located between the free portion (16) and the portion (14) connected to the electrical component (4).

14 Claims, 4 Drawing Sheets

(58) Field of Classification Search
USPC .......................................................... 439/884
See application file for complete search history.

(56) References Cited

U.S. PATENT DOCUMENTS

| | | | | |
|---|---|---|---|---|
| 6,169,654 | B1 * | 1/2001 | Krusel | H05K 5/0069 |
| | | | | 361/679.55 |
| 7,172,431 | B2 * | 2/2007 | Beaman | H01R 13/2464 |
| | | | | 439/71 |
| 7,563,112 | B2 * | 7/2009 | Honda | H01R 43/0256 |
| | | | | 439/79 |
| 8,690,586 | B2 * | 4/2014 | Schneider | H01R 12/91 |
| | | | | 439/66 |
| 9,263,820 | B2 * | 2/2016 | Mattiuzzo | H01R 13/415 |
| 10,010,006 | B2 * | 6/2018 | Tanaka | H05K 5/0069 |
| 10,729,021 | B1 * | 7/2020 | Sanchez | H01R 12/721 |
| 10,834,833 | B1 * | 11/2020 | Yoder | H05K 5/0069 |
| 2004/0067695 | A1 * | 4/2004 | Marceau | H01R 13/405 |
| | | | | 439/773 |
| 2006/0046528 | A1 * | 3/2006 | Beaman | G01R 1/07314 |
| | | | | 439/66 |
| 2008/0144260 | A1 * | 6/2008 | Honda | H05K 3/3405 |
| | | | | 361/748 |
| 2009/0197439 | A1 * | 8/2009 | Nabilek | H01R 12/585 |
| | | | | 439/825 |
| 2011/0088479 | A1 | 4/2011 | Urase et al. | |
| 2012/0295490 | A1 * | 11/2012 | Schneider | H01R 12/91 |
| | | | | 29/423 |
| 2014/0199861 | A1 * | 7/2014 | Mattiuzzo | H01R 13/415 |
| | | | | 29/842 |
| 2018/0035555 | A1 * | 2/2018 | Kaneko | H01R 12/7005 |
| 2019/0157815 | A1 | 5/2019 | Vigouroux et al. | |

FOREIGN PATENT DOCUMENTS

| | | | | |
|---|---|---|---|---|
| EP | 2940801 | B1 * | 3/2020 | ............ H01R 12/58 |
| FR | 3 073 987 | A1 | 5/2019 | |
| FR | 3 095 899 | A1 | 11/2020 | |
| JP | 2001-324402 | A | 11/2001 | |
| JP | 2008-139032 | A | 6/2008 | |
| JP | 2009-129576 | A | 6/2009 | |
| JP | 4591510 | B2 * | 1/2010 | ........... H01R 12/724 |
| JP | 2014-107154 | A | 6/2014 | |
| JP | 5575314 | B1 * | 8/2014 | ........... H05K 5/0043 |
| JP | 2016-82168 | A | 5/2016 | |
| JP | 2017-67644 | A | 4/2017 | |
| JP | 2019-29143 | A | 2/2019 | |
| WO | WO-03026078 | A1 * | 3/2003 | ........... H01R 12/724 |
| WO | WO 2006/123915 | A1 | 11/2006 | |
| WO | WO-2014110563 | A1 * | 4/2014 | ........... H01R 13/415 |
| WO | WO-2020/255564 | A1 | 12/2020 | |

OTHER PUBLICATIONS

Japanese Office Action issued Feb. 12, 2025 in Japanese Patent Application No. 2024-556753 (with English Translation), 11 pages.
Chinese Office Action and Search Report issued May 1, 2025, in Chinese Patent Application No. 202380020467.X with English translation, 16 pgs.
Japanese Office Action issued Sep. 2, 2025 in Japanese Patent Application No. 2024-556753 (with English translation), 12 pages.
European Office Action issued Oct. 27, 2025 in European Patent Application No. 23713385.5 (with English translation), 12 pages.

* cited by examiner

Fig. 4
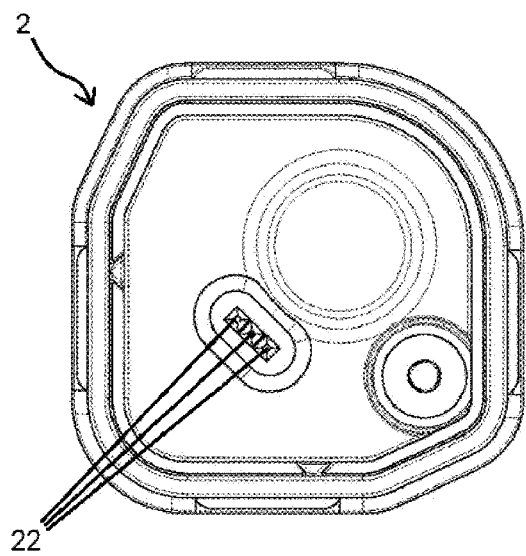
Fig. 5
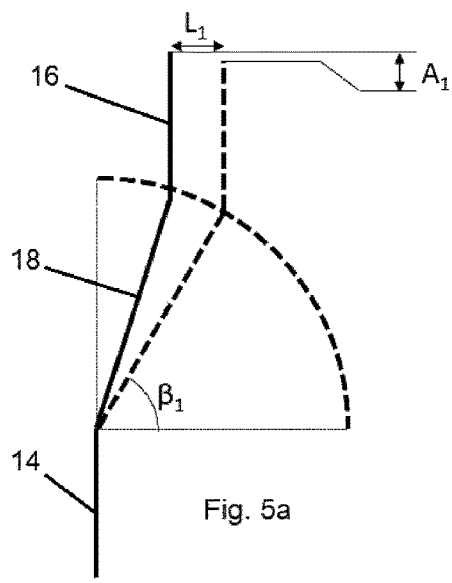
Fig. 5a
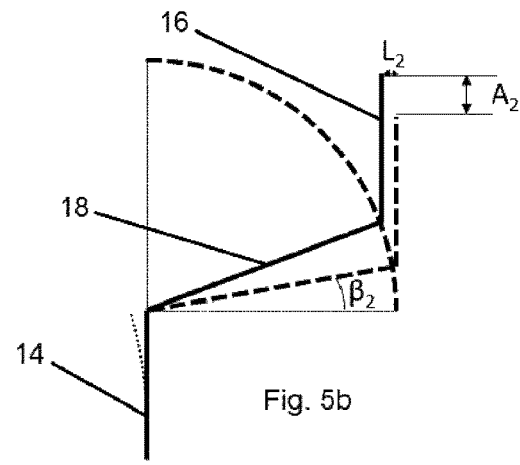
Fig. 5b

CONNECTION DEVICE FOR AN ELECTRICAL COMPONENT

The invention relates to electrical connections in the automotive field, in particular the electrical connections of electrical and electronic components in a motor vehicle, for example the electrical components of a vehicle fuel tank. More specifically, the invention relates to a connection device for an electrical component and a method for manufacturing such a connection device.

In the prior art, the use of electrical components in automobiles is known for performing various functions related to the use of a vehicle fuel tank. Non-limiting examples include components such as electrically controlled valves or sensors designed to take measurements in the tank. These electrical components are connected to an electrical network designed to supply them with power and/or to control them. To this end, the vehicle must be equipped with elements allowing these electrical components to be electrically connected to the electrical network.

For this purpose, it is known to equip an electrical component with a connection device whose function is to allow this connection. It can include electrical pins, made of an electrically conductive material, electrically connected to the electrical component and facilitating electrical connection with the electrical network. The portion of the electrical network intended for connection with the electrical pins can be in the form of a female member which can be attached to the electrical pins to ensure electrical connection. The female member is held in a coupling member, while the electrical component and electrical pins are contained in a housing. Documents FR 3 073 987 A1, WO 2006/123915 A1 and FR 3 095 899 A1 disclose such connection devices, the first of these documents disclosing a connection device according to the preamble of claim 8.

One issue with this type of connection is the cooperation between the electrical pins and the female member. In fact, the housing and the coupling member must be able to cooperate with each other to allow a good electrical connection between the electrical pins and the female member. In other words, the electrical connection depends on good cooperation between the housing and the coupling member. It is therefore necessary to control the position of the free ends of the electrical pins in relation to the housing so that the connection of the coupling member to the housing allows for a good connection of the electrical pins to the female member, which is not guaranteed in the case where the coupling member and the housing are manufactured separately. In particular, the coupling member and/or the female member can be defined by standards, in particular connection standards, which must be taken into consideration when designing the connection device so that it is suitable and compatible with the coupling member.

One solution to this problem is to add an additional intermediary element dedicated to ensuring the connection between the electrical pins and the female member. Depending on their configuration, a suitable type of intermediary element can be selected from known devices, such as an electrical domino and complementary electrical pins. However, this solution is unsatisfactory in that it requires the use of an additional element, which increases the manufacturing cost of the electrical component. Furthermore, the interior space of a vehicle generally offers very little empty space, so it is preferable not to increase the number of elements in order to be able to respect this space constraint. Furthermore, different types of coupling devices will require different types of intermediary elements, which would complicate the use of the electrical component.

One aim of the invention is to remedy these issues by ensuring compatibility for an electrical connection between the electrical component and the coupling member without the need for an additional element dedicated to this function.

To this end, the invention provides a method for manufacturing a connection device for an electrical component, the device comprising a housing, an electrical component accommodated in the housing, and at least one electrical pin, the at least one electrical pin comprising a portion connected to the electrical component and a free portion, wherein the following step is implemented:

a connection interface comprising at least one opening in the housing so that the free portion of the at least one electrical pin passes through the at least one opening, the at least one electrical pin further comprises a deformable portion located between the free portion and the portion connected to the electrical component, and in which the following step is implemented:

the deformable portion of the at least one electrical pin is deformed and the free portion of the at least one electrical pin is locked in the at least one opening so that a free end of the free portion of the at least one electrical pin extends a predetermined distance from the at least one opening.

Thus, by virtue of the deformable portion of the at least one electrical pin, the at least one electrical pin can be slid into the opening to a predetermined position ensuring good cooperation with a female member that would cooperate with the connection interface, before locking the at least one electrical pin in this position. It is thus understood that it is not necessary to provide an additional element to ensure the proper connection of the at least one electrical pin in the interface. In addition, this solution allows for adapting the electrical pins to different configurations of the female member without the need to modify the architecture of the connection device, making the invention highly flexible and adaptable. In the end, this solution allows for compensating for dimensional play and variations of the electrical connection elements assembled together.

Advantageously, the deformable portion of the at least one electrical pin comprises at least two bends arranged so that the free portion and the portion connected to the electrical component extend along respective axes forming an angle $\alpha$ between them, such that the angle $\alpha$ is between 0° and 30°.

The flexible portion of the at least one electric pin is thus easy to make and easy to deform.

In a preferred embodiment, the angle $\alpha$ is equal to 0° so that the axes are parallel to each other.

In this way, the presence of the deformable portion does not alter the general orientation of the electrical pin in the connection device, which allows the overall architecture of the connection device to remain unaffected.

Advantageously, the free portion of the at least one electrical pin is locked in the at least one opening by crimping, soldering, swaging, snapping or form-fitting.

The locking of the at least one electrical pin in the at least one opening is thus easy to implement, with means that can be chosen to better suit the architecture of the connection device.

Advantageously, the connection interface forms a protective cover sized to close the housing.

The electrical component is thus protected within the housing.

Advantageously, a coupling member, comprising at least one orifice, is attached to the connection interface so that the at least one orifice of the coupling member communicates with the at least one opening of the connection interface.

In this way, this provides the connection interface of a coupling member for coupling a female member for connection with the free portion of the electrical pins. This facilitates the electrical connection between the electrical pins and the female member.

Preferably, the coupling member is made in one piece with the connection interface.

This reduces the number of components making up the connection device, making it inexpensive and simple to manufacture.

Advantageously, the connection device comprises a plurality of identical electrical pins and a plurality of identical openings.

This makes the invention adaptable to different architectures for the connection device.

The invention also provides a connection device for an electrical component, comprising:
  a housing,
  an electrical component accommodated in the housing,
  at least one electrical pin comprising a portion connected to the electrical component and a free portion, and
  a connection interface attached to the housing, the connection interface comprising at least one opening allowing passage of the free portion of the at least one electrical pin and locking of the free portion of the at least one electrical pin in the at least one opening, a free end of the free portion of the at least one electrical pin extending at a predetermined distance from the at least one opening,
  the at least one electrical pin further comprises a deformable portion located between the free portion and the portion connected to the electrical component.

Advantageously, the deformable portion of the at least one electrical pin comprises at least two bends arranged so that the free portion and the portion connected to the electrical component extend along respective axes forming an angle α between them, such that the angle α is between 0° and 30°.

In a preferred embodiment, the angle α is equal to 0° so that the axes are parallel to each other.

Advantageously, an angle β formed between the deformable portion and a plane perpendicular to the connected portion is less than 45° or less than 30°.

This configuration allows for a significant possible variation in the position of the free end of the free portion in the direction of the free portion. This effectively compensates for play in the direction of the free portion in the connection device without generating mechanical stresses that could damage the electrical pin.

Advantageously, the free portion of the at least one electrical pin is locked in the at least one opening by crimping, soldering, swaging, snapping or form-fitting.

Advantageously, the connection interface forms a protective cover sized to close the housing.

Advantageously, the device also comprises a coupling member, comprising at least one orifice, attached to the connection interface in such a way that the at least one orifice of the coupling member communicates with the at least one opening of the connection interface.

Preferably, the coupling member is made in one piece with the connection interface.

Advantageously, the connection device comprises a plurality of identical electrical pins and a plurality of identical openings.

BRIEF DESCRIPTION OF THE FIGURES

The invention will be better understood upon reading the following description, which is provided merely as example and with reference to the appended drawings, wherein:

FIG. 4 is a perspective view of a connection interface of the connection device of FIG. 1, FIGS. 5*a* and 5*b* are profile views of an electrical pin of the connection device of FIG. 1 in two different configurations.

FIGS. 1 and 2 show a connection device 2 for an electrical component 4 according to the invention. The connection device 2 and the electrical component 4 are here intended to equip a vehicle tank (not shown), the electrical component 4 being intended to perform a function within the tank. According to one embodiment, this is an electrically controlled valve, commonly referred to as an "e-valve", but it is possible to design the electrical component in a completely different form.

Figure 3:
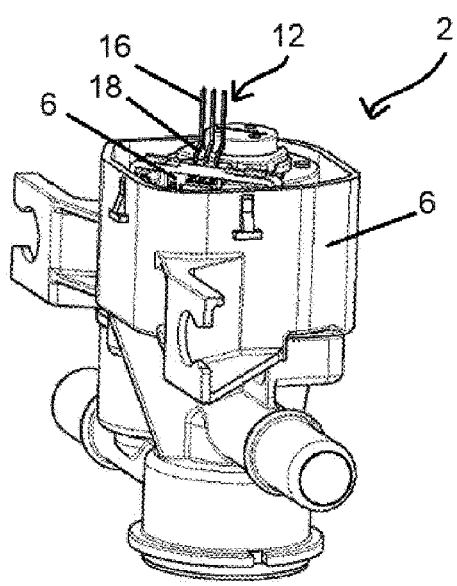
FIG. 3 is a perspective view of a housing of the connection device shown in FIG. 1.

The connection device 2 comprises a housing 6, here made of a plastic material, in which the electrical component 4 is accommodated as shown in FIG. 3. The housing 6 comprises a support 8 configured to support and hold the electrical component 4 stationary in a determined position of the housing 6. In one embodiment, the support 8 is fixed in the housing 6 and the electrical component 4 is fixed in the support 8.

Figure 1:
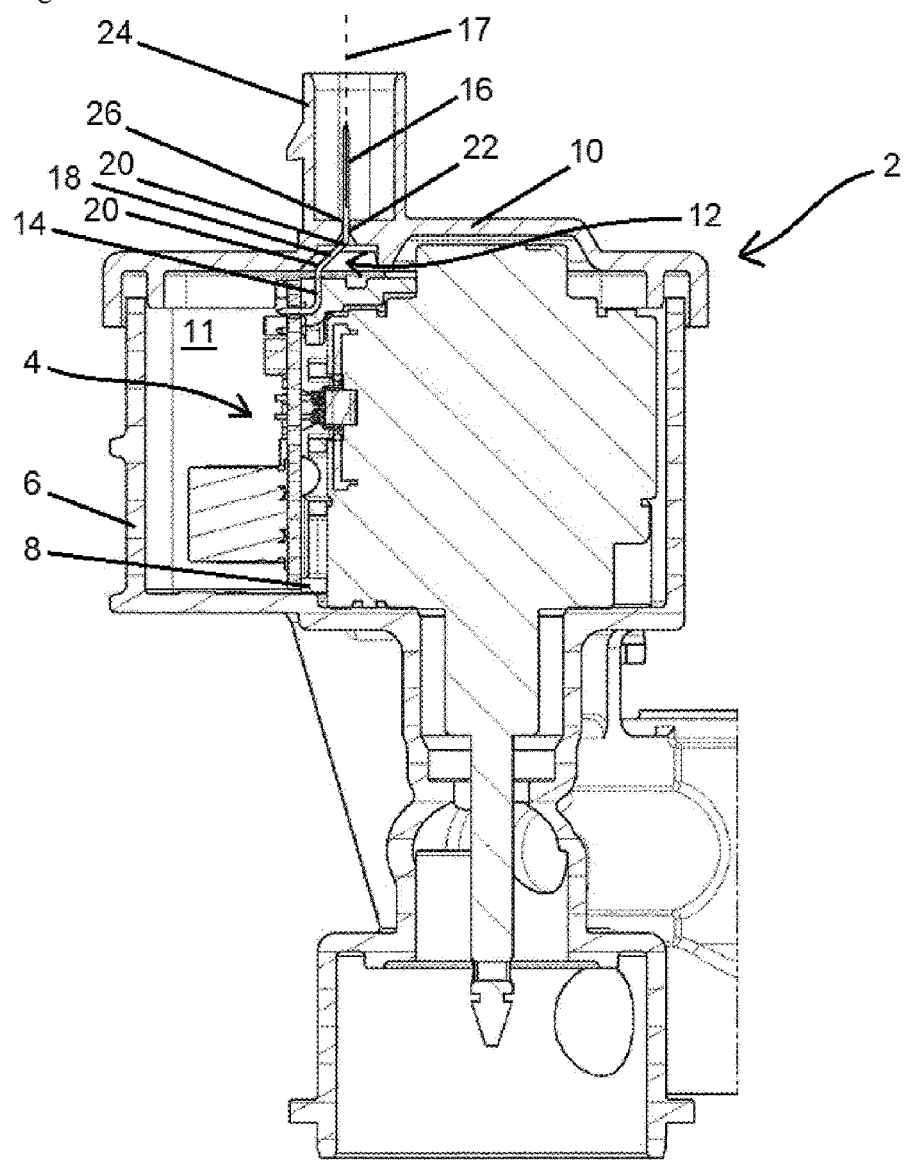
FIG. 1 is a sectional view of a connection device of an electrical component according to one embodiment of the invention.
Figure 2:
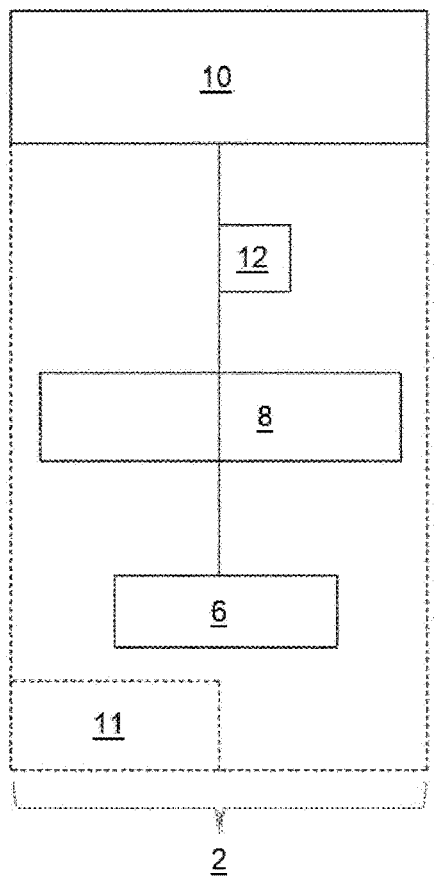
FIG. 2 is a schematic view of the connection device shown in FIG. 1.

The housing 6 is open on one of its sides, in this case the upper side in FIG. 1, which may correspond to the side facing upwards when the housing 6 is installed in a vehicle. This open portion of the housing 6 is closed by a connection interface 10, shown in FIG. 4, which is attached to the housing 6 to form an internal volume 11 defined by the housing 6 and the connection interface 10. In other words, the connection interface 10 forms a protective cover dimensioned to close the housing 6. The housing 6 and the connection interface 10 form two separate parts. The connection interface 10 is fixed to the housing 6 by any means, and it may be envisaged that this fixing is removable, in the sense that it is possible to disassemble the connection interface 10 from the housing 6 without these elements being destroyed or damaged.

The connection device 2 comprises at least one electrical pin 12 made of an electrically conductive material. The number of electrical pins 12 is arbitrary. In the embodiment shown in the figures, the connection device 2 comprises three electrical pins. If the number of electrical pins is greater than or equal to 2, the electrical pins are preferably identical.

Each electrical pin 12 comprises a portion connected to the electrical component, referred to as the connected portion 14, a free portion 16 and a deformable portion 18 located between the free portion 16 and the connected portion 14. The connected portion 14 is attached to the electrical component 4, passes through the support 8 and extends entirely into the housing 6. The free portion 16 extends partially inside the internal volume 11 and partially outside of it. The connected portion 14 and free portion 16 each have the shape of a straight rod, at least in an area adjacent to the deformable portion 18. In particular, the free portion 16 defines a main axis 17 of the electric pin 12. The deformable portion 18 comprises at least two bends 20 arranged so that the free portion 16 and the connected portion 14 extend along respective axes, at least in the area adjacent to the deformable portion 18, forming between them an angle α, such that the angle α is between 0° and 30°. In the configuration illustrated in FIGS. 1, 3, 5a and 5b, the angle α is equal to 0°, so that the connected portion 14 and the free portion 16 extend along axes parallel to each other. By bending the bends 20 to a greater or lesser extent, the shape of the deformable portion 18 can be changed, thus altering the position of the free portion 16 relative to the connected portion 14.

One of the electrical pins 12 is shown in greater detail in FIGS. 5a and 5b. In these figures, the angle β is defined as the angle formed between the deformable portion 18 and the plane perpendicular to the connected portion 14. This angle provides a definition of the term "deformable" characterizing the deformable portion 18 of the electric pin 12, in that it is possible to deform the electric pin 12 and vary the angle β, without the electric pin 12 breaking.

In the configuration shown in FIG. 5a, the angle $β_1$ is greater than 45°, or even greater than 60°. As shown by the dashed lines, a change in the angle $β_1$ moves the free end of the free portion 16 of the electrical pin 12. This free end is slightly displaced along the main axis 17 ($A_1$), i.e. in the direction of the free portion 16, and strongly displaced in a direction perpendicular to the main axis 17 ($L_1$). In this way, this configuration allows for only a slight variation in the axial position of the free end of the free portion 16.

In the configuration shown in FIG. 5b, the angle $β_2$ is less than 45°, or even less than 30°. As shown by the dashed lines, a variation in the angle β2 moves the free end of the free portion 16 of the electrical pin 12. This free end is strongly displaced along the main axis 17 ($A_2$), i.e. in the direction of the free portion 16, and slightly displaced in a direction perpendicular to the main axis 17 ($L_2$). In this way, this configuration allows for a significant possible variation in the axial position of the free end of the free portion 16, which is preferable in the context of the invention to the configuration shown in FIG. 5a.

In other words, it is advantageous for the angle β to be less than 45°, or even less than 30°, for example approximately equal to 15°. A geometrically equivalent definition is to choose the angle β so that a variation of this angle, by deformation of the deformable portion 18, allows for a displacement of more than 0.3 mm of the free end of the free portion 16 along the main axis 17. Such a value effectively compensates for axial play in the connection device 2, taking into account the typical dimensions of the connection device, without generating mechanical stresses that could damage the electrical pin 12.

To further reduce mechanical stresses that could damage the electrical pin 12, the connected portion 14 can also be designed to be deformable. As shown by the dashed lines in FIG. 5b, the small displacement of the free end of the free portion 16 in the direction perpendicular to the main axis 17 ($L_2$) can be compensated by a slight deformation of the connected portion 14 (see the dashed curve) when the free end of the free portion 16 must remain on the main axis 17.

Figure 6:
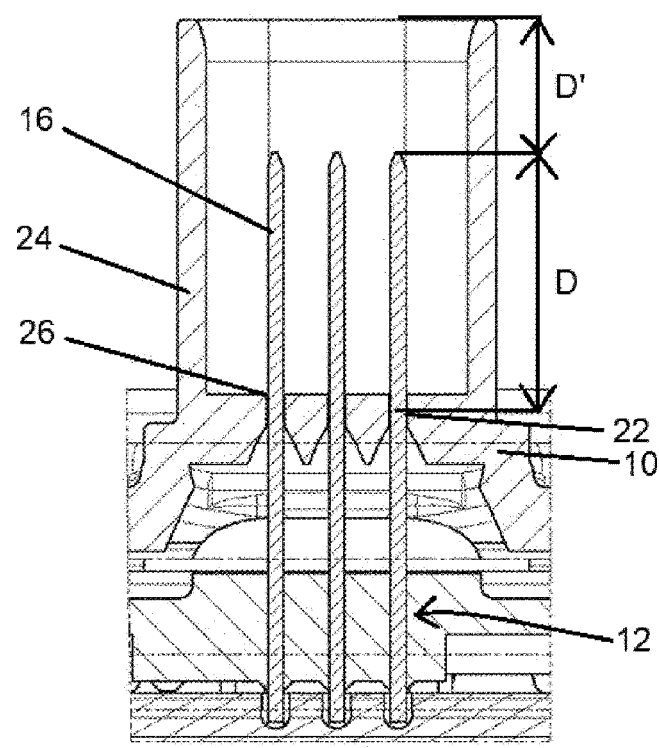
FIG. 6 is a cross-sectional view illustrating the electrical pin arrangement of the device of FIG. 1 in the connection interface.

The connection interface 10 comprises three openings 22, i.e. a number equal to the number of electrical pins 12, each allowing the free portion 16 of one of the electrical pins 12 to pass through and then be locked. Thus, the free portion 16 of each electrical pin 12 extends partially into the internal volume 11 and partially out of this internal volume 11 beyond the openings 22. The locking of the free portion 16 of each electrical pin 12 in the openings is achieved in such a way that a free end of each free portion 16 extends to a predetermined distance D from the openings 22 as shown in FIG. 6. The locking of the free portion 16 of each electrical pin 12 is achieved by crimping, soldering, swaging, snapping or form-fitting.

The connection device 2 comprises a coupling member 24 which comprises at least one orifice 26 and which is attached to the connection interface 10 in such a way that the at least one opening 26 of the coupling member 24 communicates with the openings 22 of the connection interface 10. The number of orifices 26 here is equal to the number of openings 22, but it is possible to provide a coupling member 24 with a single orifice, for example in the form of a slot, communicating with each of the apertures. The free portions 16 of the electrical pins 12 pass through the openings 22 and the orifices 26. The coupling member 24 forms a receptacle for a female member (not shown) configured to be electrically connected to the free portions 16 of the electrical pins 12, which then function as an electrical socket. The dimensions of the coupling member 24 are generally standardized and known, so that a distance D' separating the free end of the free portion 16 of the electrical pins 12 from a free end of the coupling member 24 can be deduced from the distance D defined above.

In the illustrated embodiment, the coupling member 24 and the connection interface 10 are made in one piece. In one embodiment, the coupling member is attached to the connection interface and fixed to said interface.

To manufacture the connecting device 2, the following steps are carried out:

the connection interface 10 is attached to the housing 6 so that the free portions 16 of the electrical pins 12 pass through the openings 22, and the deformable parts 18 of the electrical pins 12 are deformed and the free portions 16 of the electrical pins 12 are locked in the openings 22 so that the free ends of the free portions 16 of the electrical pins 12 extend a predetermined distance D from the openings 22.

The invention is not limited to the embodiment presented, and other embodiments will become clearly apparent to those skilled in the art.

The connection interface openings provided for each of the electrical pins can be replaced by a single opening capable of accommodating all the electrical pins and locking them in the opening.

The deformable portion of the at least one electrical pin can have more than two bends, which allows for greater freedom to move the free portion relative to the connected portion. This increases the adaptability of the connection device.

LIST OF REFERENCES

2: connection device
4: electrical component
6: housing
8: support
10: connection interface
11: internal volume
12: electrical pin
14: connected portion
16: free portion
17: main axis 18: deformable portion
20: bend
22: opening
24: coupling member
26: orifice

The invention claimed is:

1. A method for manufacturing a connection device for an electrical component, the device comprising a housing, an electrical component accommodated in the housing, and at least one electrical pin,
   the at least one electrical pin comprising a portion connected to the electrical component and a free portion,
   in which the following step is carried out:
   a connection interface comprising at least one opening is attached to the housing so that the free portion of the at least one electrical pin passes through the at least one opening,
   wherein the at least one electrical pin further comprises a deformable portion located between the free portion and the portion connected to the electrical component and in that the following step is implemented:
   the deformable portion of the at least one electrical pin is deformed and the free portion of the at least one electrical pin is locked in the at least one opening so that one end of the free portion of the at least one electrical pin extends a predetermined distance from the at least one opening,
   wherein an angle β formed between the deformable portion and a plane perpendicular to the connected portion is less than 45° or less than 30°.

2. The method according to claim 1, wherein the deformable portion of the at least one electrical pin comprises at least two bends arranged so that the free portion and the portion connected to the electrical component extend along respective axes forming between them an angle α, such that the angle α is between 0° and 30°.

3. The method according to claim 1, wherein the free portion of the at least one electrical pin is locked in the at least one opening by crimping, soldering, swaging, snapping or form-fitting.

4. The method according to claim 1, wherein the connection interface forms a protective cover dimensioned to close the housing.

5. The method according to claim 1, wherein a coupling member, comprising at least one orifice, is attached to the connection interface in such a way that the at least one orifice of the coupling member communicates with the at least one opening of the connection interface.

6. The method according to claim 5, wherein the coupling member is made in one piece with the connection interface.

7. The method according to claim 1, wherein the connection device comprises a plurality of identical electrical pins and a plurality of identical openings.

8. A connection device for an electrical component, comprising:
   a housing,
   an electrical component accommodated in the housing,
   at least one electrical pin comprising a portion connected to the electrical component and a free portion, and
   a connection interface attached to the housing, the connection interface comprising at least one opening allowing passage of the free portion of the at least one electrical pin and locking of the free portion of the at least one electrical pin in the at least one opening, one end of the free portion of the at least one electrical pin extending at a predetermined distance from the at least one opening,
   wherein the at least one electrical pin further comprises a deformable portion located between the free portion and the portion connected to the electrical component, and
   wherein an angle β formed between the deformable portion and a plane perpendicular to the connected portion is less than 45° or less than 30°.

9. The connection device according to claim 8, wherein the deformable portion of the at least one electrical pin comprises at least two bends arranged so that the free portion and the portion connected to the electrical component extend along respective axes forming between them an angle α, such that the angle α is between 0° and 30°.

10. The connection device according to claim 8, wherein the free portion of the at least one electrical pin is locked in the at least one opening by crimping, soldering, swaging, snapping or form-fitting.

11. The connection device according to claim 8, wherein the connection interface forms a protective cover dimensioned to close the housing.

12. The connection device according to claim 8, further comprising a coupling member, comprising at least one orifice, attached to the connection interface in such a way that the at least one orifice of the coupling member communicates with the at least one opening of the connection interface.

13. The connection device according to claim 12, wherein the coupling member is made in one piece with the connection interface.

14. The connection device according to claim 8, comprising a plurality of identical electrical pins and a plurality of identical openings.

* * * * *